(12) United States Patent
Hong

(10) Patent No.: US 11,456,312 B2
(45) Date of Patent: Sep. 27, 2022

(54) SEMICONDUCTOR MEMORY DEVICE

(71) Applicant: SK hynix Inc., Icheon-si Gyeonggi-do (KR)

(72) Inventor: Young Ock Hong, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 249 days.

(21) Appl. No.: 16/865,988

(22) Filed: May 4, 2020

(65) Prior Publication Data

US 2021/0098476 A1    Apr. 1, 2021

(30) Foreign Application Priority Data

Sep. 30, 2019 (KR) .................. 10-2019-0120994

(51) Int. Cl.
*H01L 27/1158* (2017.01)
*H01L 27/11573* (2017.01)
*H01L 27/11565* (2017.01)

(52) U.S. Cl.
CPC .... *H01L 27/1158* (2013.01); *H01L 27/11565* (2013.01); *H01L 27/11573* (2013.01)

(58) Field of Classification Search
CPC ........... H01L 27/1158; H01L 27/11565; H01L 27/11573; H01L 27/11575; H01L 27/11582; H01L 27/1157; H01L 27/11524; H01L 27/11529; H01L 27/11556; H01L 29/66833; H01L 29/792
See application file for complete search history.

(56) References Cited

U.S. PATENT DOCUMENTS 9,818,693 B2 * 11/2017 Toyama ................ H01L 23/528

FOREIGN PATENT DOCUMENTS

KR    1020170125551 A    11/2017
KR    1020190026418 A    3/2019

* cited by examiner

*Primary Examiner* — Allison Bernstein
(74) *Attorney, Agent, or Firm* — William Park & Associates Ltd.

(57) ABSTRACT

A semiconductor memory device includes a substrate including a peripheral circuit; an interconnection array disposed on the peripheral circuit; a cell stack structure disposed on the interconnection array, the cell stack structure including gate electrodes stacked in a vertical direction to form a cell step structure; and a dummy stack structure disposed on the interconnection array, the dummy stack structure including sacrificial layers stacked in the vertical direction to form a dummy step structure parallel to the cell step structure. The interconnection array includes a first lower conductive pattern including a center region overlapping with a slit between the cell step structure and the dummy step structure, a first region extending to overlap with the dummy step structure from the center region, and a second region extending to overlap with the cell step structure from the center region.

15 Claims, 13 Drawing Sheets

SEMICONDUCTOR MEMORY DEVICE

CROSS-REFERENCE TO RELATED APPLICATION

The present application claims priority under 35 U.S.C. § 119(a) to Korean patent application number 10-2019-0120994 filed on Sep. 30, 2019, in the Korean Intellectual Property Office, the entire disclosure of which is incorporated herein by reference.

BACKGROUND

1. Technical Field

The present disclosure generally relates to a semiconductor memory device, and more particularly, to a three-dimensional semiconductor memory device.

2. Related Art

A semiconductor memory device includes memory cells capable of storing data. In a three-dimensional semiconductor memory device, memory cells may be three-dimensionally arranged. A memory cell array including three-dimensionally arranged memory cells may be arranged on a substrate including a peripheral circuit for controlling the memory cells. When the memory cell array is formed on the substrate including the peripheral circuit, various process failures may occur.

SUMMARY

In accordance with an embodiment of the present disclosure, a semiconductor memory device may include a substrate including a peripheral circuit; an interconnection array disposed on the peripheral circuit; a cell stack structure disposed on the interconnection array, the cell stack structure including gate electrodes stacked in a vertical direction to form a cell step structure; and a dummy stack structure disposed on the interconnection array, the dummy stack structure including sacrificial layers stacked in the vertical direction to form a dummy step structure parallel to the cell step structure.

The interconnection array may include a first lower conductive pattern including a center region overlapping with a slit between the cell step structure and the dummy step structure, a first region extending to overlap with the dummy step structure from the center region, and a second region extending to overlap with the cell step structure from the center region.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Various embodiments relate to a semiconductor memory device capable of reducing the occurrence of a failure in the semiconductor memory device.

Figure 1:
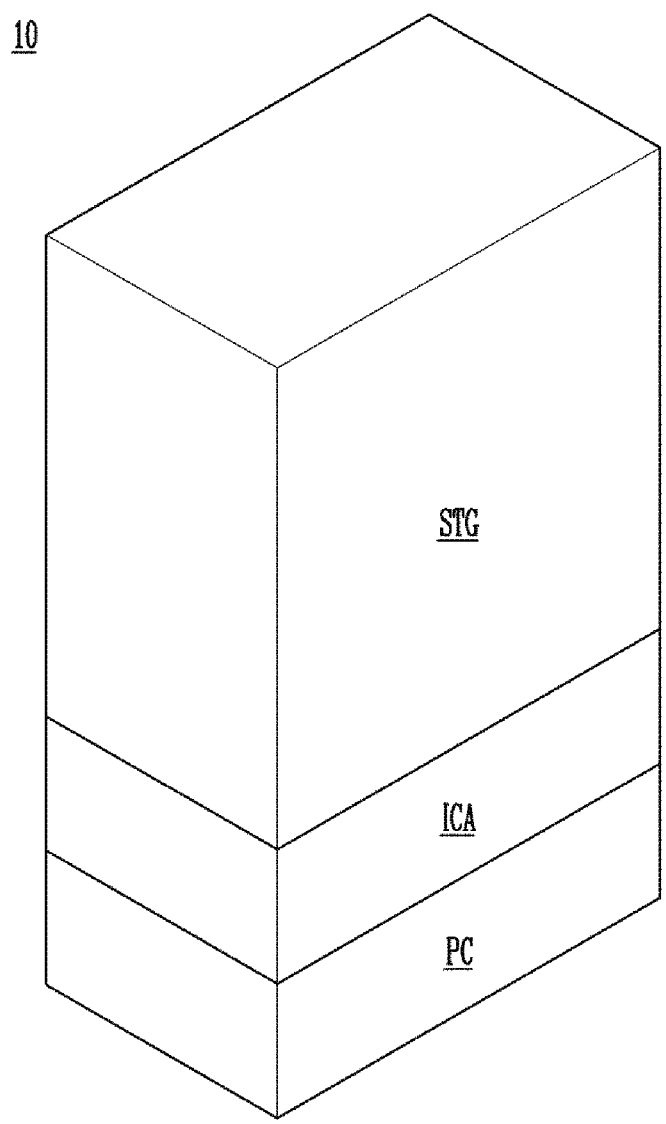
FIG. 1 is a block diagram schematically illustrating a semiconductor memory device in accordance with an embodiment of the present disclosure.

FIG. 1 is a block diagram schematically illustrating a semiconductor memory device 10 in accordance with an embodiment of the present disclosure.

Referring to FIG. 1, the semiconductor memory device 10 may include a peripheral circuit PC, an interconnection array ICA, and a stack group STG.

The peripheral circuit PC may include a row decoder, a column decoder, a page buffer, a control circuit, and the like, which constitute a circuit for controlling various operations of the semiconductor memory device 10. For example, the peripheral circuit PC may include an NMOS transistor, a PMOS transistor, a resistor, a capacitor, and the like.

The interconnection array ICA may be disposed on the peripheral circuit PC. The interconnection array ICA may include conductive patterns connected to the peripheral circuit PC. The conductive patterns of the interconnection array ICA may include lines for transmitting electrical signals, and contact plugs and contact pads, which connect the lines to the peripheral circuit PC.

The stack group STG may be disposed on the interconnection array ICA. The stack group STG may include a cell stack structure connected to memory cells and a dummy stack structure parallel to the cell stack structure.

Figure 2:
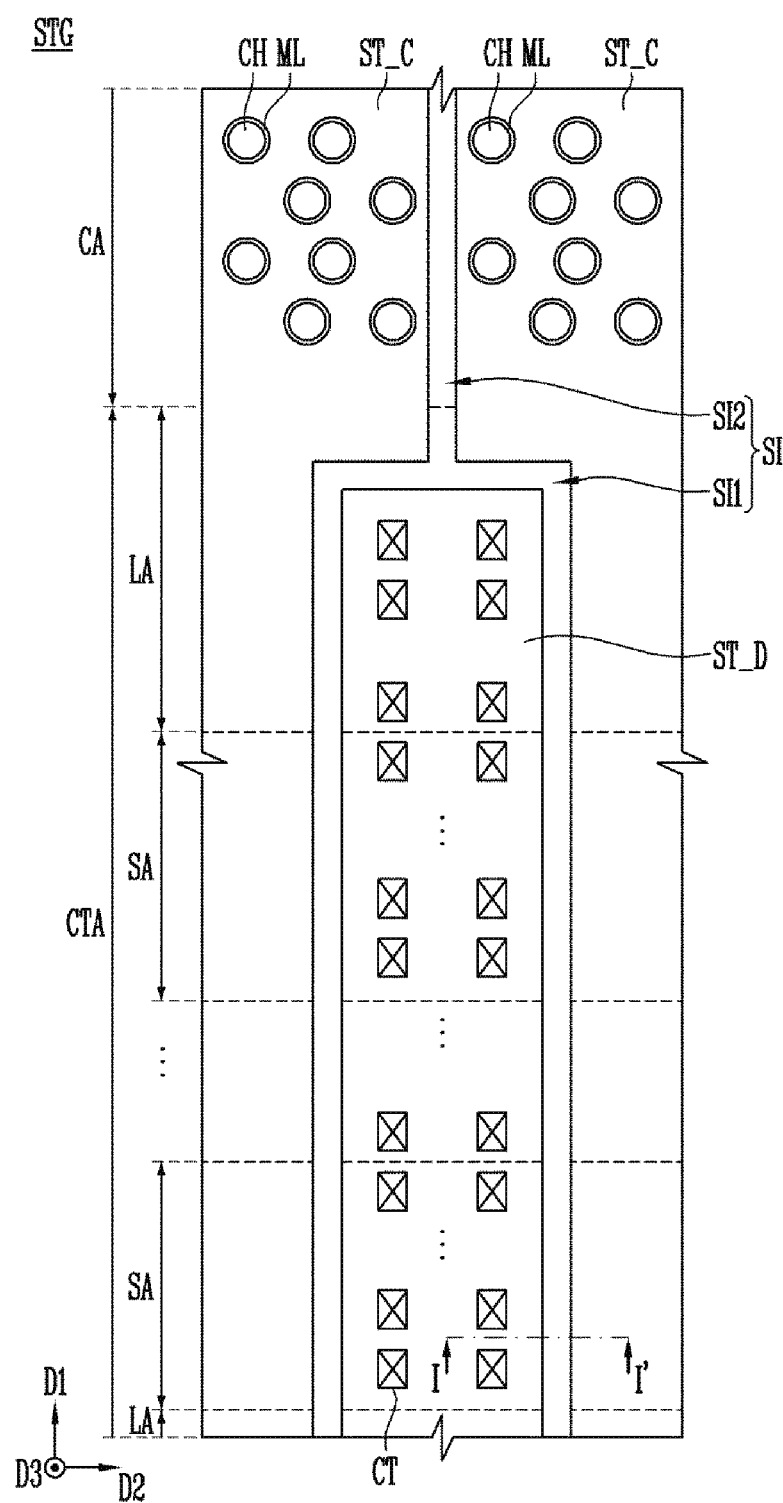
FIG. 2 is a plan view illustrating a stack group in accordance with an embodiment of the present disclosure.

FIG. 2 is a plan view illustrating a stack group STG in accordance with an embodiment of the present disclosure.

Referring to FIG. 2, the stack group STG may include a dummy stack structure ST_D and cell stack structures ST_C adjacent to the dummy stack structure ST_D. Each of the cell stack structures ST_C and the dummy stack structure ST_D may include a plurality of layers stacked in a vertical direction D3. Each of the layers stacked in the vertical direction D3 may extend in a first direction D1 and a second direction D2, which are parallel to axes intersecting each other on a plane orthogonal to an axis extending in the vertical direction D3.

The cell stack structures ST_C may respectively include contact regions CTA parallel to the dummy stack structure ST_D, and include cell regions CA extending in the first direction D1 from the contact regions CTA. The dummy stack structure ST_D may be disposed between the contact regions CTA of the cell stack structures ST_C. The cell regions CA of the cell stack structures ST_C may be adjacent to each other.

The cell stack structures ST_C and the dummy stack structure ST_D may be separated from each other by a slit SI. The slit SI may include a first slit SI1 and a second slit SI2. The first slit SI1 may be disposed between each of the cell stack structures ST_C and the dummy stack structure ST_D. The second slit SI2 may extend from the first slit SI1, and be disposed between the cell regions CA of the cell stack structures ST_C.

The dummy stack structure ST_D may be penetrated by a plurality of contact plugs CT. The contact plugs CT may extend to be connected to the interconnection array ICA described with reference to FIG. 1.

The cell region CA of each of the cell structures ST_C may be penetrated by a plurality of channel structures CH. A sidewall of each of the channel structures CH may be surrounded by a memory layer ML. Each of the channel structures CH may constitute a cell string corresponding to the channel structure CH. The channel structures CH may be arranged in a matrix pattern or be arranged in a zigzag pattern. Each of the contact regions CTA of the cell stack structures ST_C and the dummy stack structure ST_D may include connection regions LA and step regions SA. The connection regions LA and the step regions SA may be alternately disposed in the first direction D1. Each of the step regions SA may include a plurality of steps.

Figure 3:
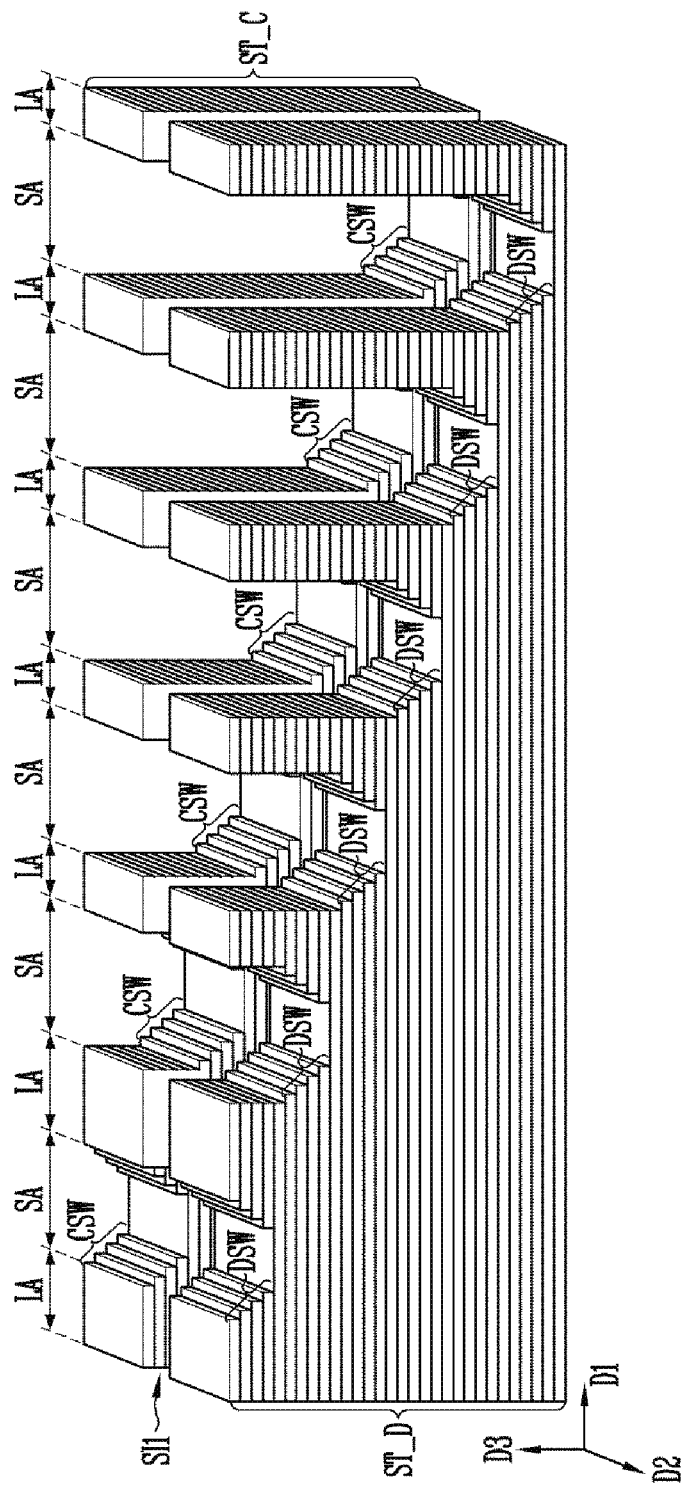
FIG. 3 is a perspective view illustrating connection regions and step regions of each of a cell stack structure and a dummy stack structure, which are shown in FIG. 2.

FIG. 3 is a perspective view illustrating connection regions LA and step regions SA of each of the cell stack structure ST_C and the dummy stack structure ST_D, which are shown in FIG. 2. In FIG. 3, illustration of contact plugs is omitted for convenience of description.

Referring to FIG. 3, each of the step regions SA may be disposed between connection regions LA adjacent in the first direction D1.

The cell stack structure ST_C may include cell step structures CSW respectively formed in the step regions SA. The cell step structures CSW may be formed in different depths in the step regions SA.

The dummy stack structure ST_D may include dummy step structures DSW respectively formed in the step regions SA. The dummy step structures DSW may be formed in different depths in step regions SA. The dummy step structures DSW may be formed in parallel to the cell step structures CSW.

Figure 4:
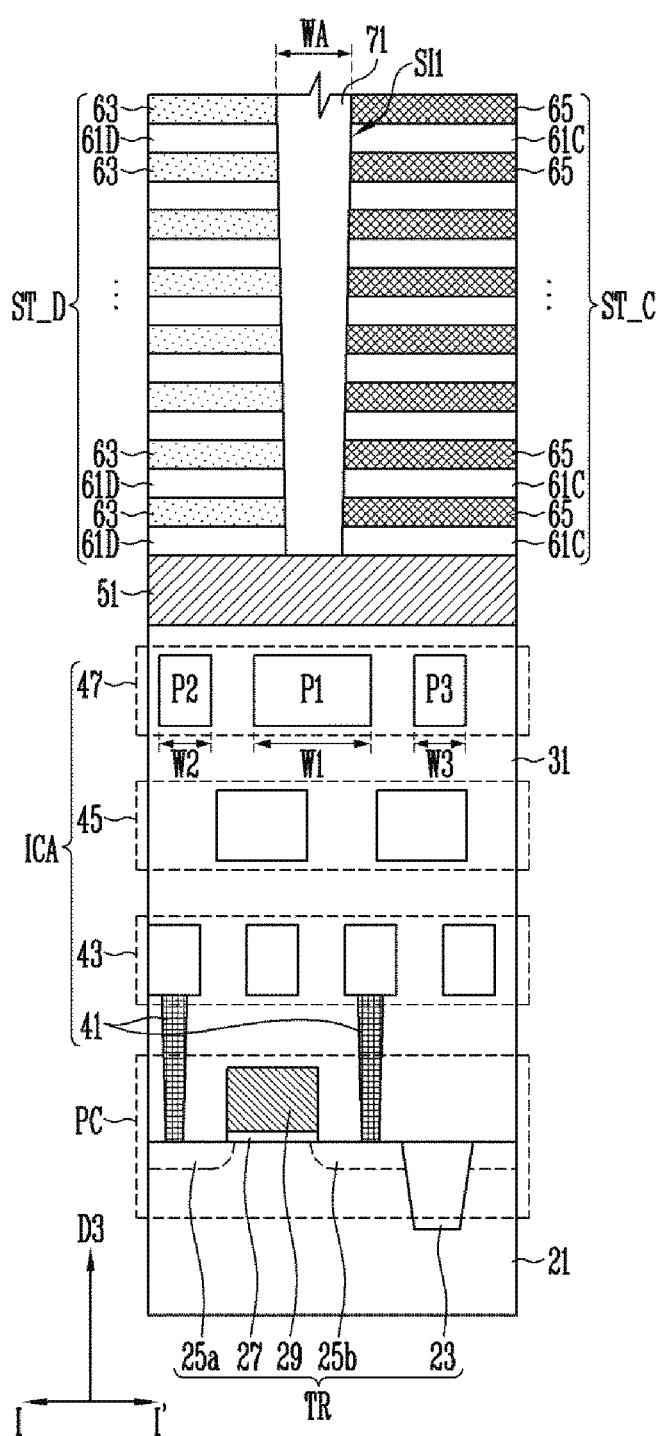
FIG. 4 is a sectional view of the semiconductor memory device taken along line I-I' shown in FIG. 2.

The dummy stack structure ST_D may include dummy interlayer insulating layers 61D and sacrificial layers 63, which are shown in FIG. 4. Each of steps defining the dummy step structures DSW may include a pair of a dummy interlayer insulating layer 61D and a sacrificial layer 63, which correspond to the dummy step structure DSW.

The cell stack structure ST_C may include cell interlayer insulating layers 61C and gate electrodes 65, which are shown in FIG. 4. Each of steps defining the cell step structures CSW may include a pair of a cell interlayer insulating layer 61C and a gate electrode 65, which correspond to the cell stack structure ST_C.

The dummy step structures DSW and the cell step structures CSW may be formed in structures symmetrical to each other with respect to the first slit SI1. The dummy step structures DSW may be spaced apart from the cell step structures CSW by the first slit SI1.

FIG. 4 is a sectional view of the semiconductor memory device taken along line I-I' shown in FIG. 2.

Referring to FIG. 4, an interconnection array ICA may be disposed on a substrate 21 including a peripheral circuit PC.

The substrate 21 may be a single crystalline semiconductor layer. For example, the substrate 21 may be a bulk silicon substrate, a silicon on insulator substrate, a germanium substrate, a germanium on insulator substrate, a silicon-germanium substrate, or an epitaxial thin film formed through a selective epitaxial growth process.

The peripheral circuit PC may include a transistor TR. The transistor TR may be formed in an active region of the substrate 21, which is defined by an isolation layer 23. The transistor TR may include a gate insulating layer 27 and a driving gate electrode 29, which are stacked on an active region corresponding to the transistor TR, and junctions 25a and 25b formed in the active region at both sides of the driving gate electrode 29. The junctions 25a and 25b may be defined by injecting a P-type impurity or N-type impurity into the active region, and be used as a drain region and a source region.

The interconnection array ICA may include a lower conductive pattern group 47. The lower conductive pattern group 47 may include lower conductive patterns P1, P2, and P3 disposed in the uppermost layer of the interconnection array ICA. The interconnection array ICA may include a plurality of patterns 41, 43, 45 disposed between the lower conductive pattern group 47 and the peripheral circuit PC. In an embodiment, the plurality of patterns 41, 43, and 45 may include a via plug group 41, a first metal line group 43, and a second metal line group 45. The via plug group 41 may include via plugs connected to the peripheral circuit PC. The first metal line group 43 may include a plurality of first metal lines disposed at the same level. The second metal line group 45 may include a plurality of second metal lines disposed at the same level. The first metal line group 43 and the second metal line group 45 may be stacked to be spaced apart from each other in the vertical direction D3 between the peripheral circuit PC and the lower conductive pattern group 47. Although not shown in the drawing, when electrical connected between the first metal line group 43 and the second metal line group 45 is required, a contact plug may be disposed between a first metal line and a second metal line, between which electrical connection is required.

The peripheral circuit PC and the interconnection array ICA may be covered with an insulating structure 31 formed on the substrate 21. The insulating structure 31 may include two or more insulating layers stacked in the vertical direction D3.

The cell stack structure ST_C and the dummy stack structure ST_D may be disposed on the insulating structure 31. The dummy stack structure ST_D may be disposed at the same level as the cell stack structure ST_C to face the cell structure ST_C.

A doped semiconductor layer 51 may be disposed between the cell stack structure ST_C and the insulating structure 31. The doped semiconductor layer 51 may extend to overlap with the dummy stack structure ST_D.

The first slit SI1 between the cell stack structure ST_C and the dummy stack structure STD may be filled with a vertical insulating layer 71. A bottom surface of the first slit SI1 and a bottom surface of the vertical insulating layer 71 may overlap with the doped semiconductor layer 51.

The cell stack structure ST_C may include cell interlayer insulating layers 61C and gate electrodes 65, which are alternately stacked in the vertical direction D3. The gate electrodes 65 and the cell interlayer insulating layers 61C may form the cell step structures CSW in the step regions SA shown in FIG. 3.

The dummy stack structure ST_D may include dummy interlayer insulating layers 61D and sacrificial layers 63, which are alternately stacked in the vertical direction D3. The sacrificial layers 63 and the dummy interlayer insulating layers 61D may form the dummy step structures DSW in the step regions SA shown in FIG. 3.

The dummy interlayer insulating layers 61D may be disposed at the same levels as the cell interlayer insulating layers 61C, and the gate electrodes 65 may be disposed at the same levels as the sacrificial layers 63. The dummy interlayer insulating layers 61D and the cell interlayer insulating layers 61C may be formed of the same material. The sacrificial layers 63 may be formed of an insulating material having an etching rate different from that of the dummy interlayer insulating layers 61D and the cell interlayer insulating layers 61C. For example, the dummy interlayer insulating layers 61D and the cell interlayer insulating layers 61C may include silicon oxide, and the sacrificial layers 63 may include silicon nitride.

Each of the gate electrodes 65 may include various conductive materials such as a doped silicon layer, a metal layer, a metal silicide layer, and a barrier layer, and include two or more kinds of conductive materials. For example, each of the gate electrode 65 may include tungsten and a titanium nitride layer (TiN) surrounding a surface of the tungsten. The tungsten is a low-resistance metal, and may reduce resistance of each of the gate electrodes 65. The titanium nitride layer (TiN) is a barrier layer, and may prevent direct contact between the tungsten and the cell interlayer insulating layers 61C.

The gate electrodes 65 may be used as source select lines, word lines, and drain select lines, which are connected to a cell string.

The lower conductive pattern group 47 may be formed of various metals. The lower conductive pattern group 47 may include a first lower conductive pattern P1 overlapping with the first slit SI1 and the vertical insulating layer 71 and second and third lower conductive patterns P2 and P3 disposed at both sides of the first lower conductive pattern P1. The first lower conductive pattern P1 may be used as a line for transmitting signals for controlling an operation of the semiconductor memory device, or be a dummy pattern which is not involved in the operation of the semiconductor memory device. The second lower conductive pattern P2 and the third lower conductive pattern P3 are lines for transmitting signals for controlling an operation of the semiconductor memory device.

Because the first lower conductive pattern P1 overlaps with the first slit SI1, the first lower conductive pattern P1 may supplement an etch stop layer function of the doped semiconductor layer 51 while the first slit SU is being formed. That is, the first lower conductive pattern P1 may serve as an etch stop layer while the first slit SU is being formed.

The first lower conductive pattern P1 may extend to overlap with the dummy stack structure ST_D and the cell stack structure ST_C at both sides of the first slit SI1. Accordingly, the first lower conductive pattern P1 may have a width wider than that of the first slit SI1 defined between a sidewall of the dummy stack structure ST_D and a sidewall of the cell stack structure ST_C (W1>WA). In order to increase the arrangement density of lines, each of the second lower conductive pattern P2 and the third lower conductive pattern P3 may be formed to have a width narrower than that of the first lower conductive pattern P1 (W2 or W3<W1).

Figure 5:
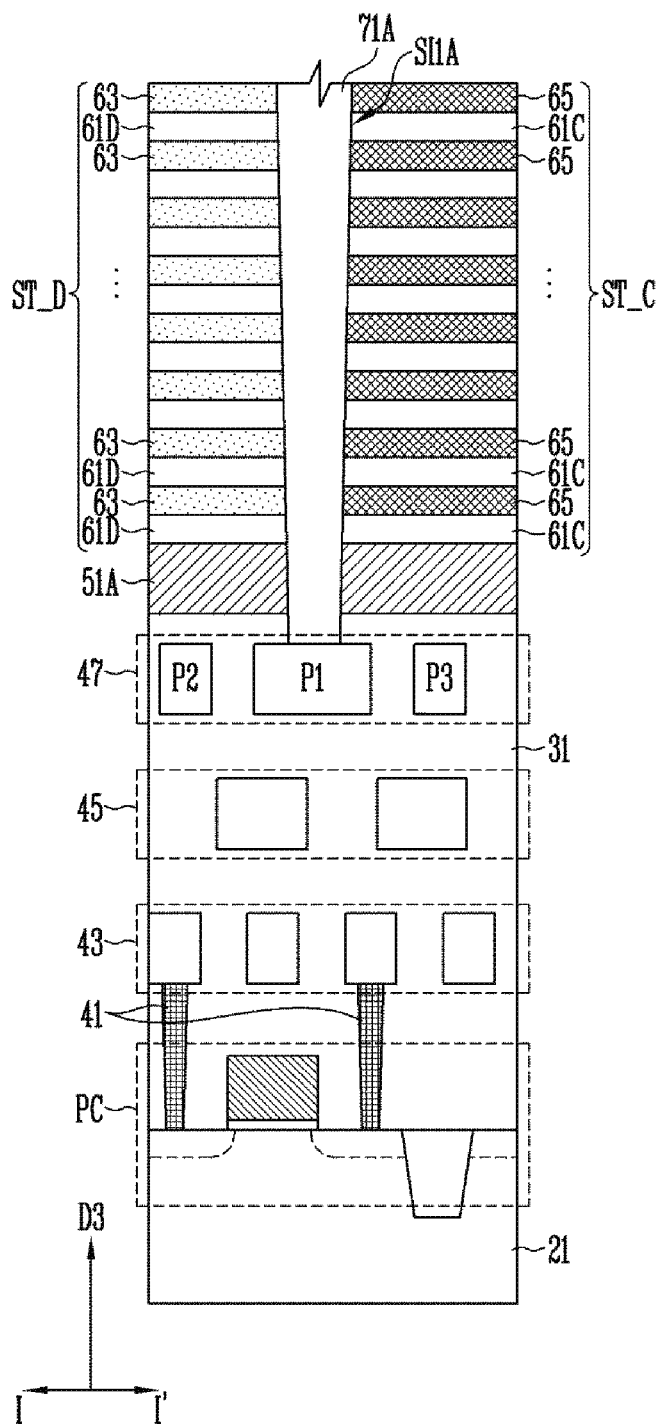
FIG. 5 is a sectional view illustrating a first slit in accordance with an embodiment of the present disclosure.

FIG. 5 is a sectional view illustrating a first slit SI1A in accordance with another embodiment of the present disclosure.

Referring to FIG. 5, a semiconductor memory device may include the substrate, the peripheral circuit PC, the via plug group 41, the first metal line group 43, the second metal line group 45, the lower conductive pattern group 47, the dummy stack structure ST_D, and the cell stack structure ST_C, as described with reference to FIG. 4. The first slit SI1A, a vertical insulating layer 71A, and a doped semiconductor layer 51A may be formed in structures different from those of the first slit SI1, the vertical insulating layer 71, and the doped semiconductor layer 51, which are described with reference to FIG. 4.

In an embodiment, while the first slit SI1A is being formed, the doped semiconductor layer 51A may be etched, and be penetrated by the first slit SI1A. The first lower conductive pattern P1 overlapping with the first slit SI1A may serve as an etch stop layer, and thus occurrence of a failure in which the second metal line group 45 disposed under the lower conductive pattern group 47 is exposed by the first slit SI1A can be reduced.

When the doped semiconductor layer 51A is penetrated by the first slit SI1A, the vertical insulating layer 71A filling the first slit SI1A may include a sidewall in contact with the doped semiconductor layer 51A, and include a bottom surface in contact with the first lower conductive pattern P1.

Figure 6A:
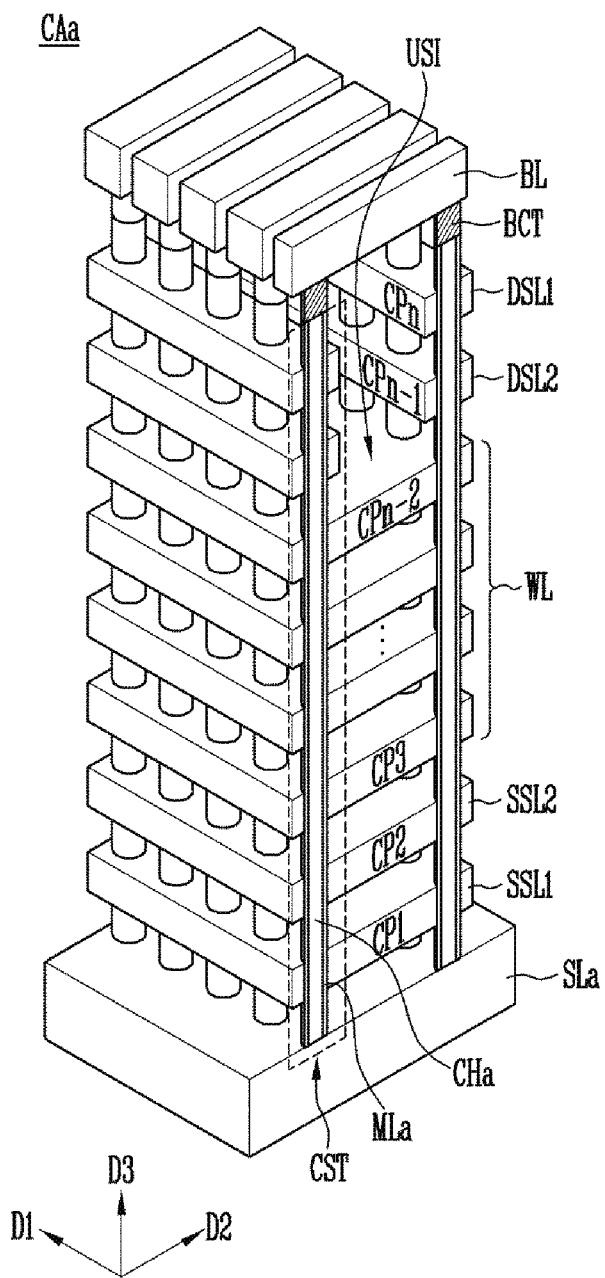
FIGS. 6A to 6C are perspective views of cell regions of cell stack structures in accordance with various embodiments of the present disclosure.
Figure 6B:
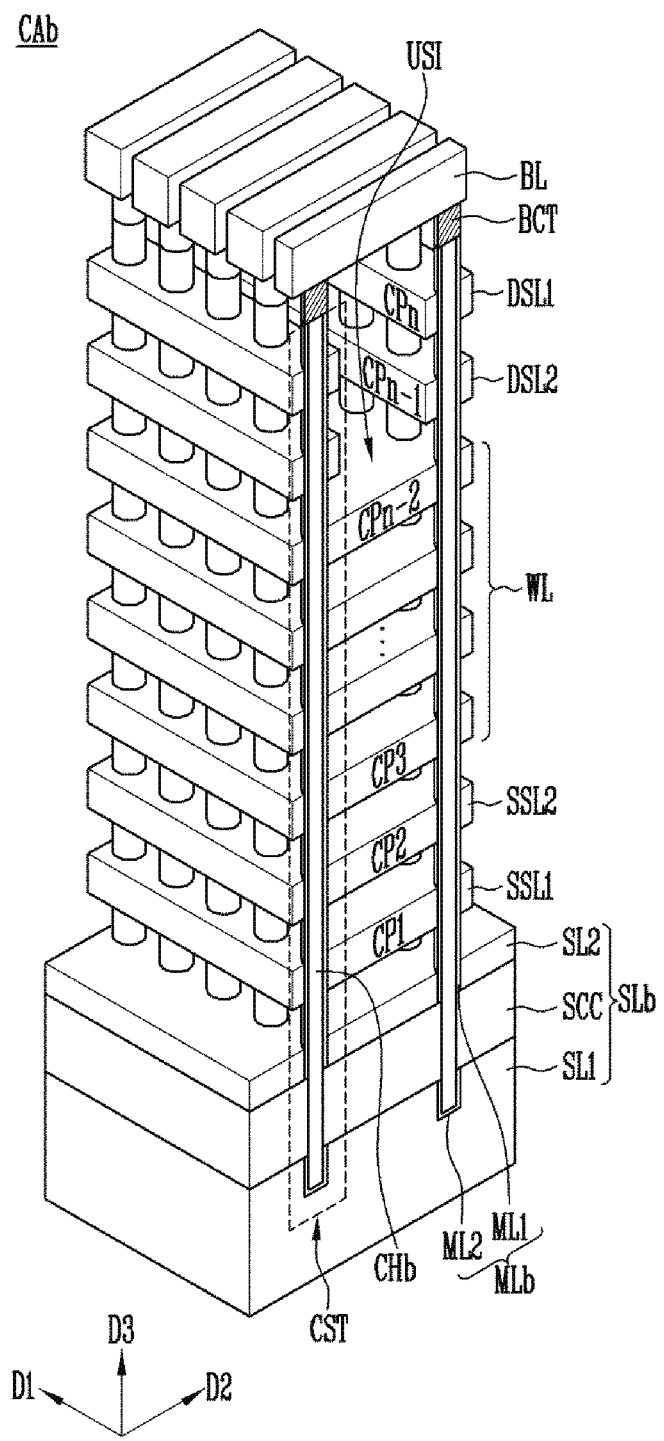
Figure 6C:
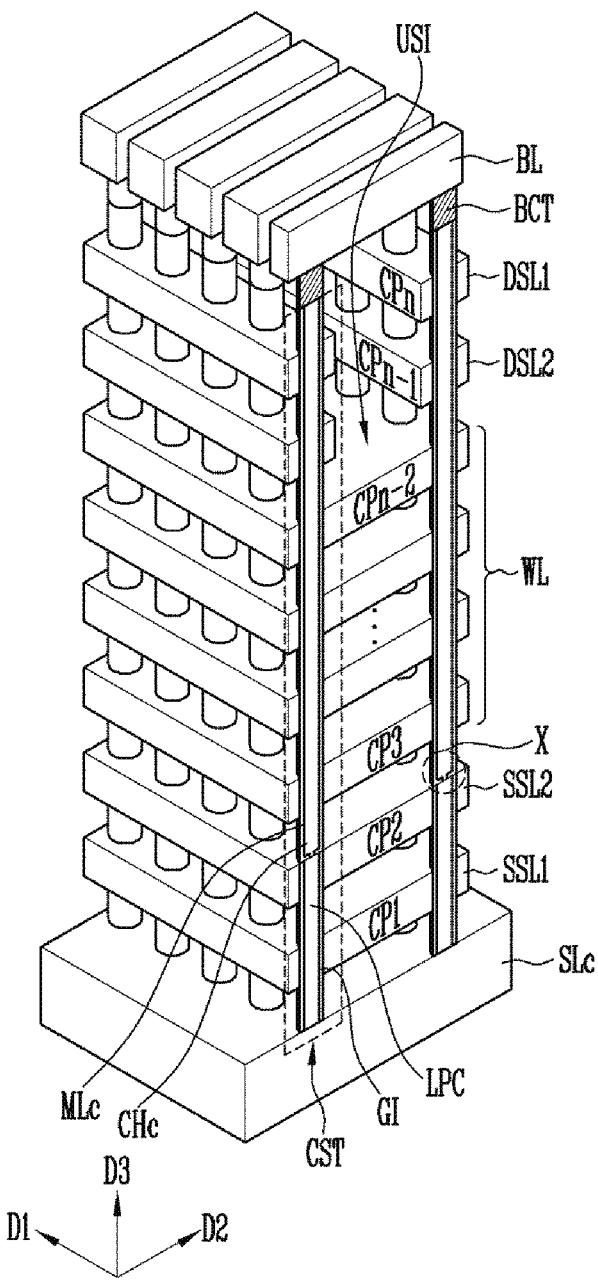

FIGS. 6A, 6B, and 6C are perspective views of cell regions CAa, CAb, and CAc, respectively, of cell stack structures in accordance with various embodiments of the present disclosure. In FIGS. 6A to 6C, cell interlayer insulating layers are not illustrated for convenience of description.

Referring to FIGS. 6A to 6C, a plurality of conductive patterns CP1 to CPn stacked in the vertical direction D3 may be arranged in each of the cell regions CAa to CAc. The plurality of conductive patterns CP1 to CPn may constitute the cell stack structure ST_C described with reference to FIGS. 2 to 5. The plurality of conductive patterns CP1 to CPn may extend from a cell region corresponding to the plurality of conductive patterns CP1 to CPn to the contact region of the cell stack structure ST_C shown in each of FIGS. 2 to 5.

Bit lines BL may be disposed above the plurality of conductive patterns CP1 to CPn. The bit lines BL may intersect the conductive patterns CP1 to CPn, and be arranged in an extending direction of the conductive patterns CP1 to CPn. For example, the plurality of conductive patterns CP1 to CPn may extend in the first direction D1, and the bit lines BL may be arranged in the first direction D1 and extend in the second direction D2.

The plurality of conductive patterns CP1 to CPn may be respectively disposed in layers from a first layer disposed most distant from the bit lines BL to an nth layer disposed closest to the bit lines BL.

nth patterns CPn disposed in at least the nth layer may be used as first drain select lines DSL1. However, the present disclosure is not limited thereto. For example, (n−1)th patterns disposed in an (n−1)th layer may be used as second drain select lines DSL2, in addition to that the nth patterns CPn disposed in the nth layer are used as the first drain select lines DSL1.

A first pattern CP1 disposed in at least the first layer may be used as a first source select line SSL1. However, the present disclosure is not limited thereto. For example, a second pattern CP2 disposed in a second layer may be used as a second source select line SSL2, in addition to that the first pattern CP1 disposed in the first layer is used as the first source select line SSL1.

Conductive patterns (e.g., CP3 to CPn−2) disposed between the first and second drain select lines DSL1 and DSL2 and the first and second source select lines SSL1 and SSL2 may be used as word lines WL.

The first drain select lines DSL1 may be separated from each other by an upper slit USI. The upper slit USI may extend between the second drain select lines DSL2, and overlap with the word lines WL and the first and second source select lines SSL1 and SSL2.

The word lines WL may be used as gate electrodes of memory cells, the first and second drain select lines DSL1 and DSL2 may be used as gate electrodes of drain select transistors, and the first and second source select lines SSL1 and SSL2 may be used as gate electrodes of source select transistors. The word lines WL and the first and second source select lines SSL1 and SSL2 may constitute the gate electrodes 65 shown in FIGS. 4 and 5.

At least one source select transistor, at least one drain select transistor, and a plurality of memory cells connected in series between the source select transistor and the drain select transistor may constitute a cell string CST. The cell string CST may include a channel structure CHa, CHb, or CHc which connects the plurality of memory cells in series.

One end of the channel structure CHa, CHb, or CHc may be connected to a bit line BL corresponding to the channel structure via a bit line contact plug BCT.

Referring to FIG. 6A, the channel structure CHa in accordance with an embodiment may penetrate a plurality of conductive patterns CP1 to CPn. The other end of the channel structure CHa may be directly connected to a source structure SLa disposed under the plurality of conductive patterns CP1 to CPn.

The source structure SLa may be in contact with a bottom surface of the channel structure CHa. The source structure SLa may constitute the doped semiconductor layer 51 described with reference to FIG. 4 or the doped semiconductor layer 51A described with reference to FIG. 5. The doped semiconductor layer 51 or 51A constituting the source structure SLa may include a source dopant. In an embodiment, the source dopant may include an N-type impurity.

A memory layer MLa may be formed between each of the conductive patterns CP1 to CPn and the channel structure CHa. The memory layer MLa may constitute the memory layer ML described with reference to FIG. 2.

Referring to FIG. 6B, the channel structure CHb in accordance with an embodiment may penetrate a plurality of conductive patterns CP1 to CPn, and extend to the inside of a source structure SLb disposed under the plurality of conductive patterns CP1 to CPn.

The source structure SLb may include a first source layer SL1, a source channel connection layer SCC, and a second source layer SL2. The first source layer SL1, the source channel connection layer SCC, and the second source layer SL2 may constitute the doped semiconductor layer 51 described with reference to FIG. 4 or the doped semiconductor layer 51A described with reference to FIG. 5. The channel structure CHb may penetrate the second source layer SL2 and the source channel connection layer SCC, and extend to the inside of the first source layer SL1. The first source layer SL1 may surround the other end of the channel structure CHb. The source channel connection layer SCC may be in direct contact with an upper surface of the first source layer SL1 and a sidewall of the channel structure CHb. The source channel connection layer SCC may extend to surround the sidewall of the channel structure CHb. Although not shown in the drawing, in an embodiment, the second source layer SL2 may be omitted.

Each of the first source layer SL1, the source channel connection layer SCC, and the second source layer SL2 may be configured with a semiconductor layer including a source dopant. In an embodiment, each of the first source layer SL1, the source channel connection layer SCC, and the second source layer SL2 may be configured with a doped silicon layer including an N-type impurity.

The sidewall of the channel structure CHb and the other end of the channel structure CHb may be surrounded by a memory layer MLb. The memory layer MLb may constitute the memory layer ML described with reference to FIG. 2. The memory layer MLb may be penetrated by the source channel connection layer SCC to be separated into a first memory pattern ML1 and the second memory pattern ML2. The first memory pattern ML1 may be disposed between each of the conductive patterns CP1 to CPn and the channel structure CHb, and extend along the sidewall of the channel structure CHb. The first memory pattern ML1 may extend between the second source layer SL2 and the channel structure CHb. The second memory pattern ML2 may be disposed between the first source layer SL1 and the channel structure CHb.

Referring to FIG. 6C, the channel structure CHc in accordance with an embodiment may penetrate first and second drain select lines DSL1 and DSL2 and word lines WL, and be connected to a lower channel structure LPC. A memory layer MLc may be formed between each of the first and second drain select lines DSL1 and DSL2 and the word lines WL and the channel structure CHc. The memory layer MLc may constitute the memory layer ML described with reference to FIG. 2. The memory layer MLc may extend along a sidewall of the channel structure CHc.

The lower channel structure LPC may penetrate first and second source select lines SSL1 and SSL2. A gate insulating layer GI may be disposed between each of the first and second source select lines SSL1 and SSL2 and the lower channel structure LPC. The gate insulating layer GI may extend along a sidewall of the lower channel structure LPC.

Figure 7:
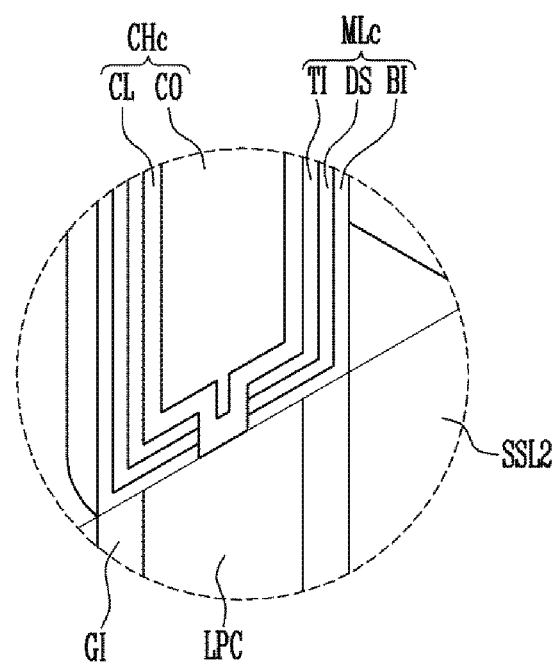
FIG. 7 is an enlarged view of region X shown in FIG. 6C.

FIG. 7 is an enlarged view of region X shown in FIG. 6C.

Referring to FIGS. 6C and 7, the lower channel structure LPC may be disposed under the channel structure CHc corresponding to the lower channel structure LPC, and be connected to a bottom surface of the channel structure CHc. The lower channel structure LPC may be configured with a doped semiconductor layer. For example, the lower channel structure LPC may be formed of N-type doped silicon.

The lower channel structure LPC may include an upper surface in contact with the channel structure CHc and a bottom surface in contact with a source structure SLc.

The source structure SLc may constitute the doped semiconductor layer 51 described with reference to FIG. 4 or the doped semiconductor layer 51A described with reference to FIG. 5. The doped semiconductor layer 51 or 51A constituting the source structure SLc may include a source dopant. In an embodiment, the source dopant may include an N-type impurity.

The channel structure CHc may be connected to the source structure SLc via the lower channel structure LPC.

The memory layer MLc may include a tunnel insulating layer TI, a data storage layer DS, and a blocking insulating layer BI, which are sequentially stacked on a surface of the channel structure CHc. The data storage layer DS may be formed of a material layer capable of storing data changed using Fowler-Nordheim tunneling. To this end, the data storage layer DS may be formed of various materials. For example, the data storage layer DS may be formed of a nitride layer in which charges can be trapped. However, the present disclosure is not limited thereto, and the data storage layer DS may include silicon, a phase change material, nano dots, and the like. The blocking insulating layer BI may include an oxide layer capable of blocking charges. The tunnel insulating layer TI may be formed of a silicon oxide layer through which charges can tunnel. Each of the memory layer ML shown in FIG. 2, the memory layer MLa shown in FIG. 6A, and the memory layer MLb shown in FIG. 6B may include the tunnel insulating layer TI, the data storage layer DS, and the blocking insulating layer BI, which are described above.

The channel structure CHc may include a core insulating layer CO disposed in a central region of the channel structure CHc and a channel layer CL extending along a surface of the core insulating layer CO. The channel layer CL may extend between the lower channel structure LPC and the core insulating layer CO. The channel layer CL may be formed of a semiconductor layer such as silicon. Each of the channel structure CH shown in FIG. 2, the channel structure CHa shown in FIG. 6A, and the channel structure CHb shown in FIG. 6B may include the core insulating layer CO and the channel layer CL, which are described above. Although not shown in the drawing, in another embodiment, the core insulating layer CO may be omitted, and the channel layer CL may be formed to fill the central region of the channel structure CHc corresponding to the channel layer CL.

The plurality of conductive patterns CP1 to CPn described with reference to FIGS. 6A to 6C may extend to the contact region of the cell stack structure, and form the cell step structures CSW in the contact region as described with reference to FIG. 5. The steps defining the cell step structures CSW may provide regions in which gate contact plugs are disposed.

Figure 8:
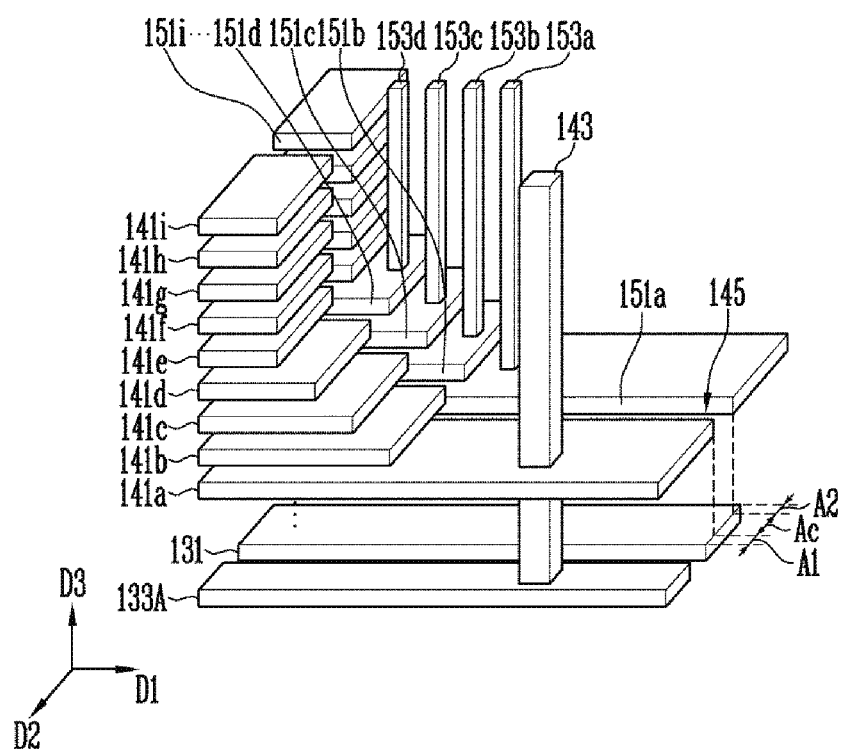
FIGS. 8 and 9 are perspective views illustrating various embodiments of gate contact plugs connected to a cell step structure and a contact plug penetrating a dummy step structure.
Figure 9:
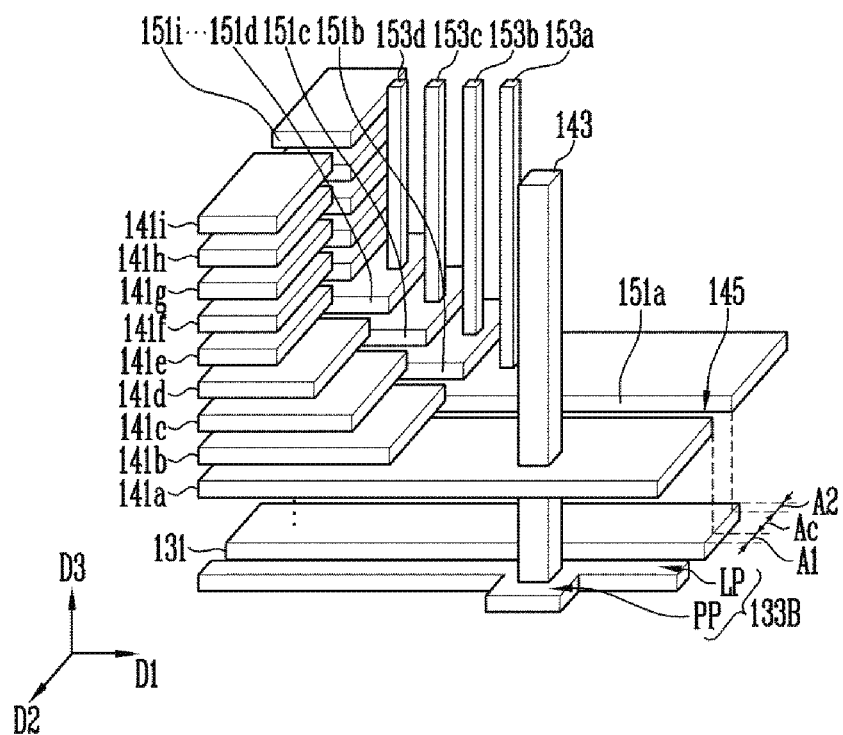

FIGS. 8 and 9 are perspective views illustrating various embodiments of gate contact plugs 153a to 153d connected to a cell step structure and a contact plug 143 penetrating a dummy step structure.

Referring to FIGS. 8 and 9, some (e.g., 151a to 151d) of gate electrodes 151a to 151i stacked in the vertical direction D3 may form a cell step structure. The gate electrodes 151a to 151d constituting steps of the cell step structure may constitute some of the gate electrode 65 shown in FIGS. 4 and 5 or constitute some of the first and second source select lines SSL1 and SSL2 and the word lines WL, which are shown in FIGS. 6A to 6C.

The steps of the cell step structure may be connected to the gate contact plugs 153a to 153d. That is, the gate electrodes 151a to 151d may include parts which are connected to the gate contact plugs 153a to 153d and constitute the steps. The gate contact plugs 153a to 153d may extend in the vertical direction D3 from the gate electrodes 151a to 151d.

Sacrificial layers 141a to 141i may be disposed in parallel to the gate electrodes 151a to 151i. The sacrificial layers 141a to 141i may be stacked in the vertical direction D3, and some (e.g., 141a to 141d) of the sacrificial layers 141a to 141i may form a dummy step structure parallel to the cell step structure. The sacrificial layers 141a to 141d constituting steps of the dummy step structure may constitute some of the sacrificial layers 63 shown in FIGS. 4 and 5.

Although not shown in the drawings, dummy interlayer insulating layers may be disposed between the sacrificial layers 141a to 141i adjacent in the vertical direction D3, and cell interlayer insulating layers may be disposed between the gate electrodes 151a to 151i adjacent in the vertical direction D3.

The cell step structure and the dummy step structure, which are shown in FIGS. 8 and 9, may constitute a pair of a cell step structure CSW and a dummy step structure DSW, which are parallel to each other, among the cell step structures CSW and the dummy step structures DSW, which are shown in FIG. 3.

The gate electrodes 151a to 151i may be spaced apart from the sacrificial layers 141a to 141i through a first slit 145 extending in the first direction D1 and the vertical direction D3. The first slit 145 may overlap with a first lower conductive pattern 131 of a lower conductive pattern group. The lower conductive pattern 131 of the lower conductive pattern group may constitute the first lower conductive pattern P1 of the lower conductive pattern group 47 described with reference to FIGS. 4 and 5.

The first lower conductive pattern 131 may include a center region Ac overlapping with the first slit 145, a first region A1 extending to overlap with the dummy step structure from the center region Ac, and a second region A2 extending to overlap with the cell step structure from the center region Ac. A width of the first lower conductive pattern 131 defined between a sidewall of the first region A1 and a sidewall of the second region A2 may be formed wider than that of the first slit 145. The first lower conductive pattern 131 and the first slit 145 may extend in the first direction D1.

The lower conductive pattern group may further include a second lower conductive pattern 133A or 133B. The second lower conductive pattern 133A or 133B may be connected to the contact plug 143 penetrating at least one of the sacrificial layers 141a to 141i.

The second lower conductive pattern 133A or 133B may be disposed to be spaced apart from the first lower conductive pattern 131, and overlap with the dummy stack structure including the sacrificial layers 141a to 141i. As described with reference to FIGS. 4 and 5, the second lower conductive pattern 133A or 133B may be formed to have a width narrower than that of the first lower conductive pattern 131.

Referring to FIG. 8, a second lower conductive pattern 133A in accordance with an embodiment may extend in parallel to the first lower conductive pattern 131 to overlap with the contact plug 143, and be formed in a straight line shape. The second lower conductive pattern 133A may be formed to have a width wider than that of the contact plug 143.

Referring to FIG. 9, a second lower conductive pattern 133B in accordance with an embodiment may include a line part LP and a protrusion part PP. The line part LP may be formed to have a width narrower than the first lower conductive pattern 131, and extend in parallel to the first lower conductive pattern 131. The protrusion part PP may protrude toward the contact plug 143 from the line part LP.

For convenience of description, a doped semiconductor layer which is omitted in the drawing may be disposed between a stack group including the gate electrodes 151a to 151i and the sacrificial layers 141a to 141i, which are shown in FIGS. 8 and 9, and a lower conductive pattern group including the first lower conductive pattern 131 and the second lower conductive pattern 133A or 133B, which are shown in FIGS. 8 and 9. The doped semiconductor layer may be configured with the doped semiconductor layer 51 described with reference to FIG. 4, the doped semiconductor layer 51A described with reference to FIG. 5, or any one of the source structures SLa to SLc described with reference to FIGS. 6A to 6C.

Figure 10:
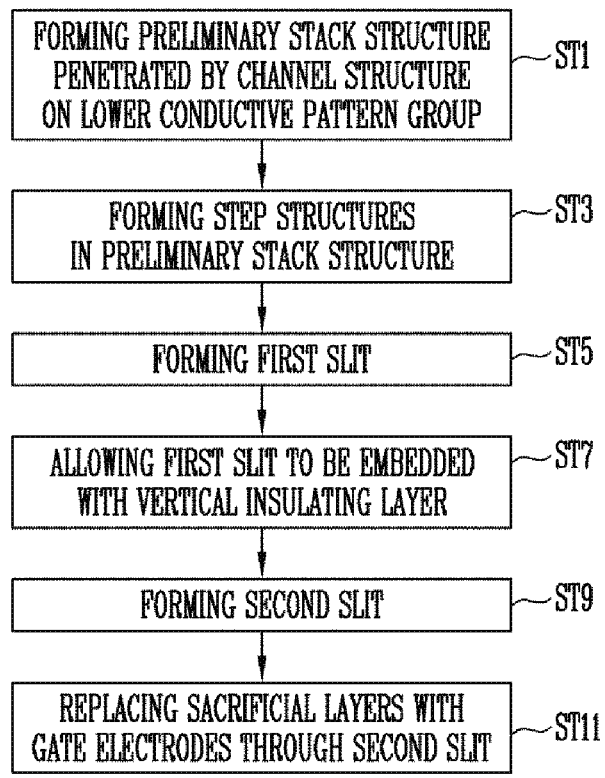
FIG. 10 is a flowchart schematically illustrating a manufacturing method of a cell step structure and a dummy step structure in accordance with an embodiment of the present disclosure.

FIG. 10 is a flowchart schematically illustrating a manufacturing method of the cell step structure and the dummy step structure in accordance with an embodiment of the present disclosure. FIG. 10 schematically illustrates processes performed after a step of forming the lower conductive pattern group described with reference to FIGS. 4, 5, 8, and 9.

Referring to FIG. 10, in step ST1, a preliminary stack structure penetrated by a channel structure may be formed on the lower conductive pattern group. The preliminary stack structure may include a doped semiconductor layer, and interlayer insulating layers and sacrificial layers, which are alternately stacked on the doped semiconductor layer. The channel structure may be connected to a doped semiconductor layer used as a source structure as described with reference to FIG. 6A, extend to the inside of a doped semiconductor layer used as a source structure as described with reference to FIG. 6B, or be connected to a lower channel structure as described with reference to FIG. 6C.

Subsequently, in step ST3, step structures may be formed in the preliminary stack structure. The step structures may be formed by etching the interlayer insulating layers and the sacrificial layers. The step structures may be disposed in different depths in step regions as described with reference to FIG. 3.

Subsequently, in step ST5, a first slit may be formed. Accordingly, the step structures formed in the step ST3 may be separated into a plurality of pairs through a first slit as shown in FIG. 3. A portion of the first slit, which penetrates step structures disposed in a relatively deep depth, may be formed deeper than a target depth. The first slit penetrating the doped semiconductor layer may be formed as shown in FIG. 5. In accordance with the embodiments of the present disclosure, the first slit overlaps with a first lower conductive pattern of a lower conductive pattern group as shown in FIGS. 4, 5, 8, and 9, so that the first lower conductive pattern can be used as an etch stop layer. As a result, a bottom surface of the first slit can be stably located on the first lower conductive pattern, and thus occurrence of a bridge failure of an interconnection array due to a punch failure caused by the first slit can be reduced.

Subsequently, in step ST7, the first slit may be embedded with a vertical insulating layer. The sacrificial layers and the interlayer insulating layers may be separated into a dummy stack structure and a preliminary cell stack structure by the first slit and the vertical insulating layer.

Subsequently, in step ST9, the second slit described with reference to FIG. 2 may be formed. The second slit may penetrate the preliminary cell stack structure defined in the step ST7.

Subsequently, in step ST11, the sacrificial layers of the preliminary cell stack structure may be replaced with gate electrodes through the second slit. Accordingly, a cell stack structure can be formed.

The step structure of the above-described dummy stack structure may include a dummy step structure defined by the sacrificial layers, and the step structure of the cell stack structure may include a cell step structure defined by the gate electrodes. The sacrificial layers of the dummy stack structure are protected by the vertical insulating layer, not to be replaced with the gate electrodes but to remain.

After the dummy step structure and the cell step structure are formed, subsequent processes for forming the gate contact plugs 153a to 153d and the contact plug 143, which are described with reference to FIGS. 8 and 9, may be performed.

Figure 11:
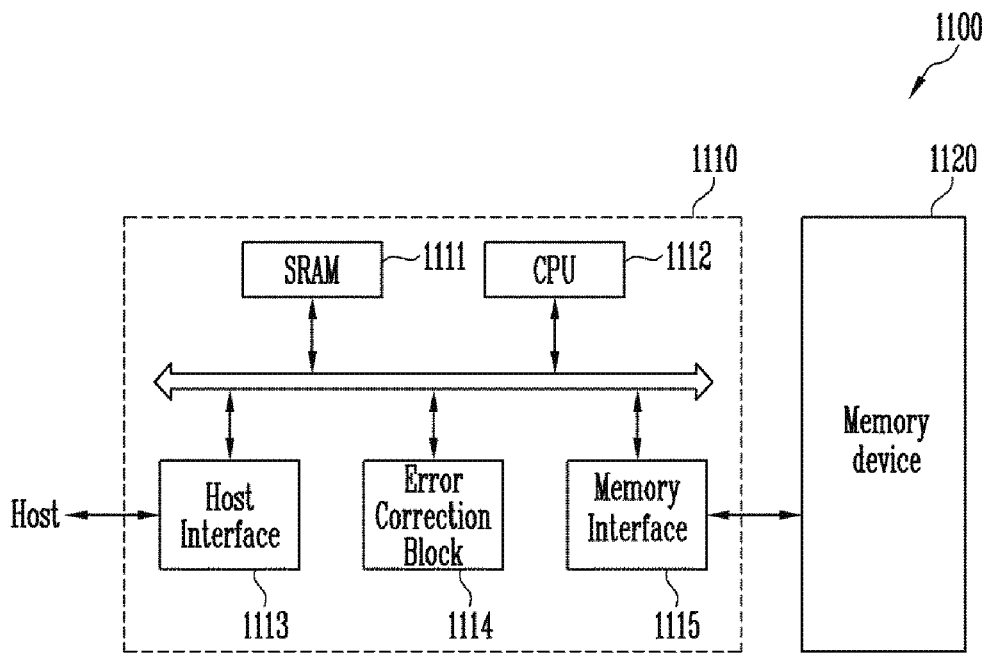
FIG. 11 is a block diagram illustrating a configuration of a memory system in accordance with an embodiment of the present disclosure.

FIG. 11 is a block diagram illustrating a configuration of a memory system 1100 in accordance with an embodiment of the present disclosure.

Referring to FIG. 11, the memory system 1100 includes a memory device 1120 and a memory controller 1110.

The memory device 1120 may be a multi-chip package configured with a plurality of flash memory chips. The memory device 1120 may include an interconnection array which transmits a signal for controlling an operation of a cell string and is disposed under the cell string. A lower conductive pattern group disposed at the uppermost layer of the interconnection array may include a lower conductive pattern overlapping with a slit. The slit may be disposed between a cell step structure configured with gate electrodes connected to the cell string and a dummy step structure parallel with the cell step structure.

The memory controller 1110 is configured to control the memory device 1120, and may include a Static Random Access Memory (SRAM) 1111, a Central Processing Unit (CPU) 1112, a host interface 1113, an error correction code circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 12:
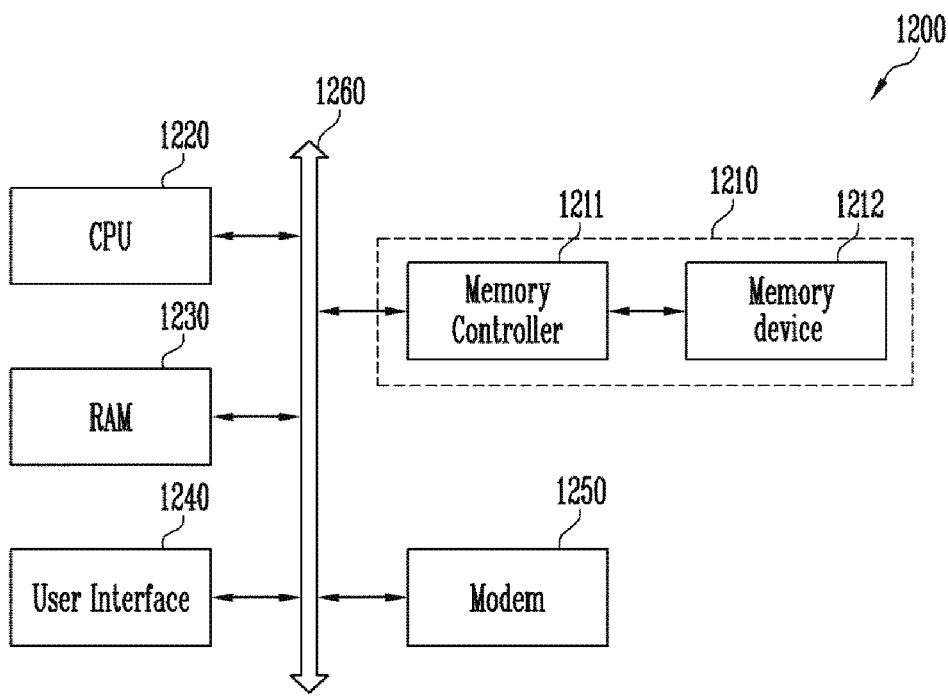
FIG. 12 is a block diagram illustrating a configuration of a computing system in accordance with an embodiment of the present disclosure.

FIG. 12 is a block diagram illustrating a configuration of a computing system 1200 in accordance with an embodiment of the present disclosure.

Referring to FIG. 12, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1200 may be configured with a memory device 1212 and a memory controller 1211.

In accordance with the present disclosure, a slit between a cell step structure and a dummy step structure overlaps with a lower conductive pattern, so that occurrence of a punch failure caused by the slit can be minimized. Accordingly, occurrence of a failure of the semiconductor memory device, which is caused by the punch failure, can be reduced.

Embodiments of the present disclosure have been described in the drawings and specification. Although specific terminologies are used herein, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood to have by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor memory device comprising:
   a substrate including a peripheral circuit;
   an interconnection array disposed on the peripheral circuit;
   a cell stack structure disposed on the interconnection array, the cell stack structure including gate electrodes stacked in a vertical direction to form a cell step structure; and
   a dummy stack structure disposed on the interconnection array, the dummy stack structure including sacrificial layers stacked in the vertical direction to form a dummy step structure parallel to the cell step structure,
   wherein the interconnection array includes a first lower conductive pattern including a center region overlapping with a slit between the cell step structure and the dummy step structure, a first region extending to overlap with the dummy step structure from the center region, and a second region extending to overlap with the cell step structure from the center region,
   wherein the sacrificial layers are disposed at the same level as the gate electrodes of the cell stack, and
   wherein each of the sacrificial layers is formed of a material different from each of the gate electrodes.

2. The semiconductor memory device of claim 1, wherein a width of the first lower conductive pattern defined between a sidewall of the first region and a sidewall of the second region is wider than a width of the slit defined between a sidewall of the dummy stack structure and a sidewall of the cell stack structure.

3. The semiconductor memory device of claim 1, further comprising:
   an insulating structure formed on the substrate to cover the peripheral circuit and the interconnection array;
   a doped semiconductor layer disposed between the insulating structure and the cell stack structure, the doped semiconductor layer extending to overlap with the dummy stack structure; and
   a vertical insulating layer filling the slit.

4. The semiconductor memory device of claim 3, wherein a bottom surface of the vertical insulating layer overlaps with the doped semiconductor layer.

5. The semiconductor memory device of claim 3, wherein the vertical insulating layer extends to penetrate the doped semiconductor layer.

6. The semiconductor memory device of claim 3, further comprising:
   a channel structure penetrating the cell structure, the channel structure connected to the doped semiconductor layer; and
   a memory layer formed between each of the gate electrodes and the channel structure.

7. The semiconductor memory device of claim 1, wherein the interconnection array further includes a first metal line and a second metal line stacked in the vertical direction between the first lower conductive pattern and the peripheral circuit.

8. The semiconductor memory device of claim 1, wherein the interconnection array further includes a second lower conductive pattern disposed at the same level as the first lower conductive pattern, wherein a width of the second lower conductive pattern is narrower than a width of the first lower conductive pattern.

9. The semiconductor memory device of claim 8, further comprising a contact plug penetrating the dummy stack structure, the contact plug connected to the second lower conductive pattern.

10. The semiconductor memory device of claim 9, wherein the second lower conductive pattern extends parallel to the first lower conductive pattern to overlap with the contact plug, and wherein the second lower conductive pattern is formed in a straight line shape.

11. The semiconductor memory device of claim 9, wherein the second lower conductive pattern incudes a line part extending parallel to the first lower conductive pattern and a protrusion part protruding toward the contact plug from the line part.

12. The semiconductor memory device of claim 1, further comprising:
    cell interlayer insulating layers alternately stacked with the gate electrodes in the vertical direction; and
    dummy interlayer insulating layers alternately stacked with the sacrificial layers in the vertical direction.

13. The semiconductor memory device of claim 1, wherein each of the sacrificial layers comprises an insulating material.

14. A semiconductor memory device comprising:
    a substrate including a peripheral circuit;
    an interconnection array disposed on the peripheral circuit;
    a cell stack structure disposed on the interconnection array, the cell stack structure including gate electrodes stacked in a vertical direction to form a cell step structure;
    a dummy stack structure disposed on the interconnection array, the dummy stack structure including sacrificial layers stacked in the vertical direction to form a dummy step structure parallel to the cell step structure; and
    a doped semiconductor layer disposed between the cell stack structure and the interconnection array and extending to overlap with the dummy stack structure,
    wherein the interconnection array includes a first lower conductive pattern including a center region overlapping with a slit between the cell step structure and the dummy step structure, a first region extending to overlap with the dummy step structure from the center region, and a second region extending to overlap with the cell step structure from the center region, and wherein the slit extends to penetrate the doped semiconductor layer.

15. A semiconductor memory device comprising:

a substrate including a peripheral circuit;

an interconnection array disposed on the peripheral circuit;

a cell stack structure disposed on the interconnection array, the cell stack structure including gate electrodes stacked in a vertical direction to form a cell step structure;

a dummy stack structure disposed on the interconnection array, the dummy stack structure including sacrificial layers stacked in the vertical direction to form a dummy step structure parallel to the cell step structure; and a contact plug penetrating the dummy stack structure, wherein the interconnection array includes a first lower conductive pattern including a center region overlapping with a slit between the cell step structure and the dummy step structure, a first region extending to overlap with the dummy step structure from the center region, and a second region extending to overlap with the cell step structure from the center region.

* * * * *